(12) United States Patent
Arnaud

(10) Patent No.: US 12,541,039 B2
(45) Date of Patent: Feb. 3, 2026

(54) OPTICAL DEVICE

(71) Applicant: STMicroelectronics (Crolles 2) SAS, Crolles (FR)

(72) Inventor: Arthur Arnaud, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 641 days.

(21) Appl. No.: 17/676,351

(22) Filed: Feb. 21, 2022

(65) Prior Publication Data

US 2022/0268965 A1  Aug. 25, 2022

(30) Foreign Application Priority Data

Feb. 23, 2021 (FR) ....................................... 2101744

(51) Int. Cl.
| | |
|---|---|
| *H01L 31/0232* | (2014.01) |
| *G02B 1/00* | (2006.01) |
| *G02B 5/02* | (2006.01) |
| *G06F 19/00* | (2018.01) |
| *H01L 31/18* | (2006.01) |
| *H10F 77/40* | (2025.01) |

(52) U.S. Cl.
CPC ............ *G02B 1/002* (2013.01); *G02B 5/0268* (2013.01); *G02B 5/0278* (2013.01); *H10F 77/413* (2025.01)

(58) Field of Classification Search
CPC .... G02B 1/002; G02B 5/0268; G02B 5/0278; H10F 77/413; H10F 77/147; H10F 39/184; H10F 39/8023; H10F 39/8067; H10F 39/807; G02F 1/116; G02F 2201/122; G02F 1/11; G02F 1/0121; G02F 1/2255; G02F 2203/055
See application file for complete search history.

(56) References Cited

U.S. PATENT DOCUMENTS

| | | | |
|---|---|---|---|
| 7,283,290 B1 * | 10/2007 | Pannell ................ | G02F 1/11 359/305 |
| 10,305,248 B2 * | 5/2019 | Mathai ............... | H01S 5/18363 |
| 10,622,498 B2 * | 4/2020 | Wang ............. | H01L 31/022408 |
| 10,700,225 B2 * | 6/2020 | Wang ................ | H04B 10/801 |
| 11,791,432 B2 * | 10/2023 | Wang ............... | H01L 31/02327 398/115 |
| 2005/0237602 A1 * | 10/2005 | Yanagisawa ............ | H01S 3/30 359/340 |

(Continued)

FOREIGN PATENT DOCUMENTS

| | | |
|---|---|---|
| CN | 110429156 A | 11/2019 |
| EP | 2523226 A1 | 11/2012 |
| WO | WO-2016081476 A1 * | 5/2016 ............ G02B 1/002 |

OTHER PUBLICATIONS

INPI Search Report and Written Opinion for priority application, FR 2101744, report dated Oct. 26, 2021, 9 pages.

*Primary Examiner* — Ajay Ojha
*Assistant Examiner* — Tsz K Chiu
(74) *Attorney, Agent, or Firm* — Crowe & Dunlevy

(57) ABSTRACT

An optical device includes a layer having a face configured to be traversed by light at an operating wavelength. The face of the layer includes a fractal structure lacking rotational symmetry such as a fractal structure that corresponds to a fractal expressed in an L-system. The fractal structure is formed by recesses that penetrate into the layer from the face. The recesses have a depth which is less that a thickness of the layer.

20 Claims, 8 Drawing Sheets

(56) References Cited

U.S. PATENT DOCUMENTS

| | | | |
|---|---|---|---|
| 2007/0190434 A1* | 8/2007 | Suda | G03F 1/29 |
| | | | 430/311 |
| 2013/0118780 A1* | 5/2013 | Zhang | H05K 3/00 |
| | | | 29/829 |
| 2016/0307939 A1* | 10/2016 | Wang | H01L 27/1446 |
| 2017/0245962 A1* | 8/2017 | Skamser | G02B 5/0221 |
| 2018/0102442 A1* | 4/2018 | Wang | H01L 31/02327 |
| 2019/0204027 A1* | 7/2019 | Cohen | G02B 1/002 |
| 2019/0288132 A1* | 9/2019 | Wang | H01L 31/1804 |

* cited by examiner

OPTICAL DEVICE

PRIORITY CLAIM

This application claims the priority benefit of French Application for Patent No. 2101744, filed on Feb. 23, 2021, the content of which is hereby incorporated by reference in its entirety to the maximum extent allowable by law.

TECHNICAL FIELD

The present disclosure relates generally to optical devices, for example, pixels and optical diffusers.

BACKGROUND

Known pixels comprise a semiconductor layer in which a photosensitive area, or photoconversion area, is defined, typically a photodiode, for example a pinned photodiode.

In order to increase the quantum efficiency of these pixels, it is desirable to provide, on one face of the layer receiving the light, structures modifying the direction of propagation of the light, which makes it possible to increase the optical path of the light in the photodiode, and thus the quantum efficiency of the pixel. This is, for example, the case when the layer is made of silicon and the light received is infrared light, for example at a wavelength of the order of 940 nm.

In addition, known optical diffusers comprise a layer through which light passes. One face of the layer through which light exits the diffuser, i.e., the face of the layer configured to emit light, comprises structures that alter the direction of light propagation. As an example, such known optical diffusers include a silicon layer when intended to diffuse infrared light, for example at a wavelength of the order of 940 nm.

There is a need to overcome some or all of the drawbacks of the known optical devices (pixels and optical diffusers) described above.

For example, it would be desirable to have pixels with higher quantum efficiency than the known pixels described above.

For example, it would be desirable to have optical diffusers that allow for better diffusion of the emitted light than the optical diffusers described above.

SUMMARY

One embodiment addresses all or some of the drawbacks of known optical devices as described above.

One embodiment provides an optical device comprising a layer having a face configured to be traversed by light at an operating wavelength of the optical device, wherein the face comprises a fractal structure lacking rotational symmetry, the fractal structure comprising recesses penetrating the layer through only a portion of a thickness of the layer.

According to one embodiment, each recess has, in a plane of the face, dimensions at least two times smaller than the operating wavelength.

According to one embodiment, the recesses are blind holes, preferably having a cylindrical, cubic, rectangular parallelepiped, or pyramidal shape, or trenches.

According to one embodiment, the fractal structure corresponds to a fractal that, expressed in an L-system, is selected from: a Hilbert curve, each segment of the Hilbert curve corresponding to a recess of the fractal structure; a Peano curve, each segment of the Peano curve corresponding to a recess of the fractal structure; and a Mandelbrot H-tree, each segment of the Mandelbrot H-tree corresponding to a recess of the fractal structure.

According to one embodiment, the fractal structure corresponds to a fractal that, expressed in an L-system, is selected from: a fractal based on ternary Cantor-type rules and whose axiom corresponds to a large square divided into nine small squares, with only the central small square of the large square corresponding to a recess in the fractal structure; a fractal based on ternary Cantor-type rules and whose axiom corresponds to a large square divided into nine small squares, where each of the small squares of the diagonals of the large square correspond to a recess of the fractal structure; and a fractal based on ternary Cantor-type rules and whose axiom corresponds to a large square divided into nine small squares, only the small squares of the corners of the large square each corresponding to a recess of the fractal structure.

According to one embodiment, the fractal structure corresponds to a fractal that, expressed in an L-system, is selected from: a fractal based on binary Cantor-type rules and whose axiom corresponds to a large square divided into four small squares, with only one of the small squares corresponding to a recess of the fractal structure; and—a fractal based on binary Cantor-type rules and whose axiom corresponds to a square divided into four small squares, with only the small squares of one diagonal of the large square each corresponding to a recess of the fractal structure.

According to one embodiment, the fractal structure is at least of order 3.

According to one embodiment, all of the recesses penetrate the layer to the same depth.

According to one embodiment, a depth of each recess in the layer decreases when the order at which the recess is generated increases.

According to one embodiment, the layer is made of silicon.

One embodiment provides a pixel comprising a photosensitive area arranged in the layer of a device as described, the face of the layer being configured to receive light and for light received by the photosensitive area to pass through the fractal structure.

One embodiment provides an optical diffuser comprising a device as described, the layer being configured to have light passing through it and the face of the layer being configured to emit light having passed through the fractal structure.

One embodiment provides a method for making an optical device as described, the method comprising the steps of: providing the layer; and etching recesses into the layer.

According to one embodiment, the etching step comprises a single etching step in which all the recesses are etched simultaneously and to the same depth.

According to one embodiment, the etching comprises etching sub-steps each corresponding to a different order of the fractal and including etching the recesses corresponding to that order of the fractal, with an etching depth of each etching sub-step decreasing when the order corresponding to the sub-step increases.

According to one embodiment, in each etching substep, previously etched recesses are masked.

According to one embodiment, additional recesses are etched at the bottom of the recesses etched in the previous etching sub-step, and, in each etching sub-step, all etched recesses have identical dimensions.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
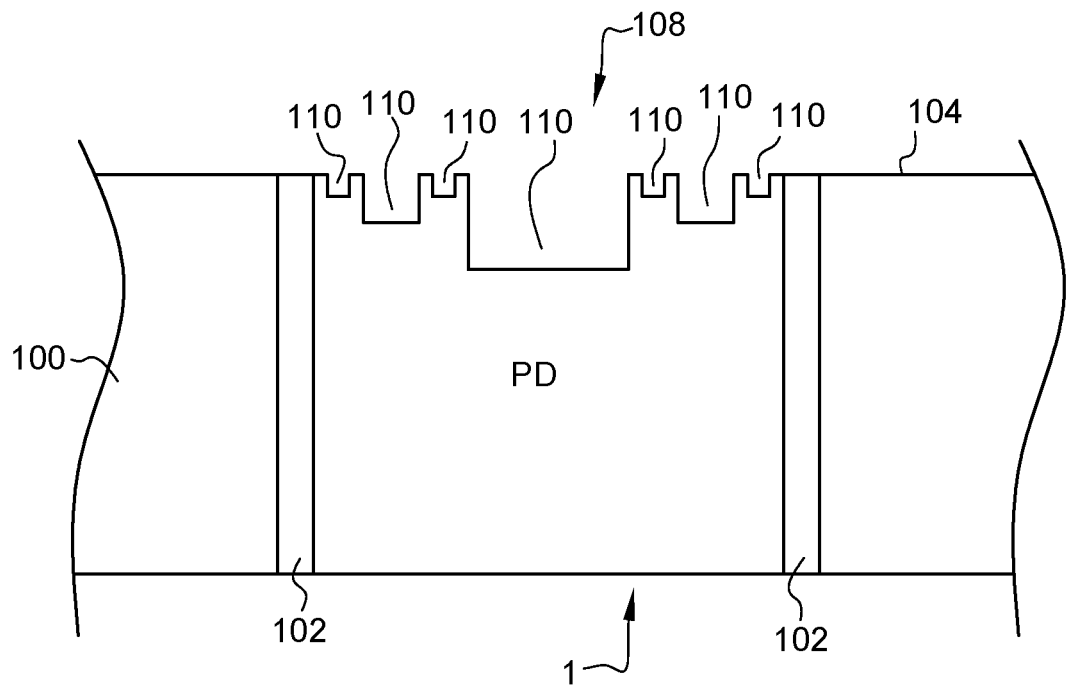
FIG. 1 represents, by a schematic cross-sectional view, an example of an embodiment of a pixel.

Like features have been designated by like references in the various figures. In particular, the structural and/or functional features that are common among the various embodiments may have the same references and may dispose identical structural, dimensional, and material properties.

For the sake of clarity, only the operations and elements that are useful for an understanding of the embodiments described herein have been illustrated and described in detail. In particular, the usual applications in which the optical devices described in the present application may be provided have not been detailed, the optical devices described being compatible with such usual applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation represented in the figures.

Unless specified otherwise, the expressions "around", "approximately", "substantially" and "in the order of" signify within 10%, and preferably within 5%.

Herein, optical devices are proposed comprising a layer having a face for light to pass through, the face presenting, or comprising, a fractal structure.

The proposed fractal structure is devoid of rotational symmetry, i.e., it is not rotationally invariant about an axis of symmetry orthogonal to the face comprising the fractal structure, which makes it simpler to implement than a fractal structure that is rotationally invariant about an axis orthogonal to the face comprising the fractal structure. Note that a structure is considered here to be rotationally invariant if and only if it is invariant regardless of the angle of the rotation.

In addition, the proposed fractal structure includes recesses penetrating the layer over only a portion of the layer thickness, which prevents light from passing through the layer without passing through the material of the layer.

The fractal structure corresponds to a fractal, or, in other words, is obtained from a fractal. Here fractals are considered that can all be expressed in an L-system, or Lindenmayer system. In a known way, an L-system comprises:—an alphabet comprising at least two characters or elements; an axiom, i.e. a starting pattern, expressed by means of one or more characters of the alphabet; and a set of generation rules, each rule corresponding to a transformation of a character of the alphabet into a pattern expressed by means of the alphabet, this transformation being implemented at each iteration of the generation of the fractal, or, in other words, one passes from a fractal of order N to a fractal of order N+1, with N an integer greater than or equal to 0, by applying the generation rules to the characters of the fractal of order N.

When the fractal structure corresponds to a fractal of order N=Z, the final order of the fractal structure is called Z and also the corresponding fractal, and fractals of order N, with N ranging from 0 to Z−1, are called intermediate fractals obtained at each iteration of applying the generation rules to obtain the fractal of final order Z. The fractal of order 0 then corresponds to the fractal axiom expressed in an L-system.

In the following description, when the characters of a fractal or its axiom are traversed starting from the top left character, and initially moving from left to right. The rule '+' means turning 90° to the right with respect to the current direction of travel of the characters, and the rule '−' means turning 90° to the left with respect to the current direction of travel of the characters.

FIG. 1 represents a schematic cross-sectional view of an example of one embodiment of an optical device, and, more particularly, of a pixel 1.

The pixel 1 is arranged in and on a semiconductor layer 100, for example made of silicon. The pixel 1 comprises a photosensitive area, or photoconversion area, (PD) arranged in the layer 100. As an example, the PD area is a pinned photodiode. The pixel 1, for example, its PD area, is preferably laterally bounded by insulating trenches 102, for example, Capacitive Deep Trench Isolation ("CDTI").

Figure 2:
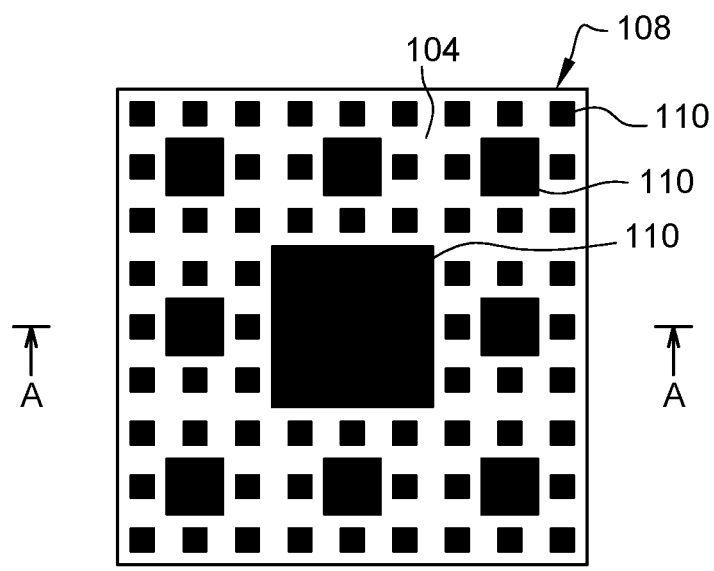
FIG. 2 represents, in a schematic top view, the pixel of FIG. 1.

The layer 100 comprises a face 104 comprising a fractal structure 108, represented in a top view in FIG. 2, with FIG. 1 being taken in a cross-sectional plane AA of FIG. 2.

The face 104 is intended to be traversed by light at the operating wavelength of the pixel 1, or, in other words, the fractal structure 108 is intended to be traversed by such light. More particularly, in this example where the optical device is a pixel, the face 104, and more particularly the fractal structure 108, is configured to receive light and for received light to pass through the fractal structure 108 to the PD area of the pixel 1.

The fractal structure 108 comprises recesses 110. More specifically, the fractal structure 108 corresponds to a fractal in which the fractal pattern is replaced by recesses 110. In other words, when the fractal structure 108 corresponds to a fractal expressed in an L-system, for at least one of the characters of the alphabet of the L-system, each occurrence of that character in the fractal corresponds to a recess 110 in the fractal structure 108, with the understanding that at least one of the characters of the fractal is not replaced by a recess 110. In the top view of FIG. 2, the recesses 110 are represented as solid areas in black.

The recesses 110 penetrate the layer 100, from the face 104, for only a portion of the thickness of the layer. Indeed, if some of the recesses 110 were to penetrate through the layer 100, this would lead to a decrease in the mechanical stability of the pixel 1, and, furthermore, lead to optical paths where light could propagate without ever encountering the material of the layer 100.

According to one embodiment, in the plane of the face 104, i.e., the plane of the sheet in FIG. 2, the dimensions of the recesses are at least two times smaller than the operating wavelength. Indeed, the optical phenomena used here are not diffractive phenomena which are based on the passage of light through an aperture whose dimensions are of the order of the wavelength of the light passing through the aperture, and which lead to the obtaining of diffraction patterns.

The fractal structure 108, or, in other words, the fractal corresponding to it, is devoid of rotational symmetry. In other words, the fractal structure 108 is not rotationally invariant about an axis orthogonal to the face 104 and passing through the center of the fractal. A fractal is considered here to be non-rotationally invariant when the fractal is not rotationally invariant for at least one angle of rotation. Thus, the fractal structure 108, while not rotationally invariant, may present rotational symmetries for only certain angles. in other words, the fractal structure 108 does not consist of concentric annular recesses. Indeed, such concentric annular recesses are difficult to implement.

By way of example, as represented in FIGS. 1 and 2, the recesses 110 are blind holes, in this example, cubic in shape. In other examples not represented, the recesses 110 are blind holes of rectangular parallelepipedal, pyramidal, or cylindrical shape. Alternatively, the recesses are trenches or portions of trenches. For example, using the example of FIG. 2, provision may be made for each cubic recess 110 to be replaced by a trench corresponding to the contour of the cubic recess 110, or by one or more trenches, for example two orthogonal trenches forming a cross, arranged in place of the cubic recess 110.

The provision of the fractal structure 108 at the face 104 of the pixel 1 intended to receive light allows the received light to be diffused in several directions in the PD area, whereby the quantum efficiency of the pixel 1 is improved. Notably, this increases the quantum efficiency of the pixel 1 relative to a similar pixel in which the structure 108 would be replaced by a single pad, a single hole, or a periodic array of pads or holes, for example, when the final order Z of the fractal structure 108 is at least equal to 3. Indeed, the patterns of the fractal structure 108 allow for a combination of multiple reflections, differences of step and diffraction to maximize both the directional dispersion of transmitted light (increase in optical path), increase the transmission of light into the pixel, and reduce the reflection of incident light by increasing the effective surface area and apparent roughness of the silicon. This apparent roughness is related to the Hausdorff dimension of fractals greater than 2 (dimension of a plane surface), which gives fractal surfaces diffusion properties similar to random rough surfaces, without resorting to random generation algorithms (construction by mathematical recurrence of the same pattern). Unlike periodic grating type patterns that require a minimum number of repetitions of the same pattern to produce diffraction patterns, themselves being periodic, the fractals allow symmetry properties to emerge as early as the order 2 due to their self-similar nature.

According to the embodiment illustrated in FIG. 1, the depth of each recess 100 decreases as the order at which the recess 110 is generated increases.

Specifically, when the fractal structure 108 corresponds to a fractal of order Z expressed in an L-system, the fractal of order Z is generated by applying, in an iterative manner, and from the axiom of the L-system, Z times the L-system rules. When a character of the L-system alphabet corresponding to a recess appears in the fractal of order N lower than Z, in other words, at the Nth application of the L-system rules, and that this character, and thus the recess 110 corresponding to it, is found in all fractals of higher orders up to the final order Z, in other words, in all fractals of order N+1 to Z, then we say that this recess 110 is generated at order N.

Thus, a recess 110 generated at order 0 is deeper than a recess 110 generated at order 1, itself being deeper than a recess 110 generated at order 2, and thus so on.

In other words, in this embodiment, and as seen in FIGS. 1 and 2, the depth of the recesses 110 decreases as their lateral dimensions, taken in a plane parallel to the face 104, decrease.

Figure 3:
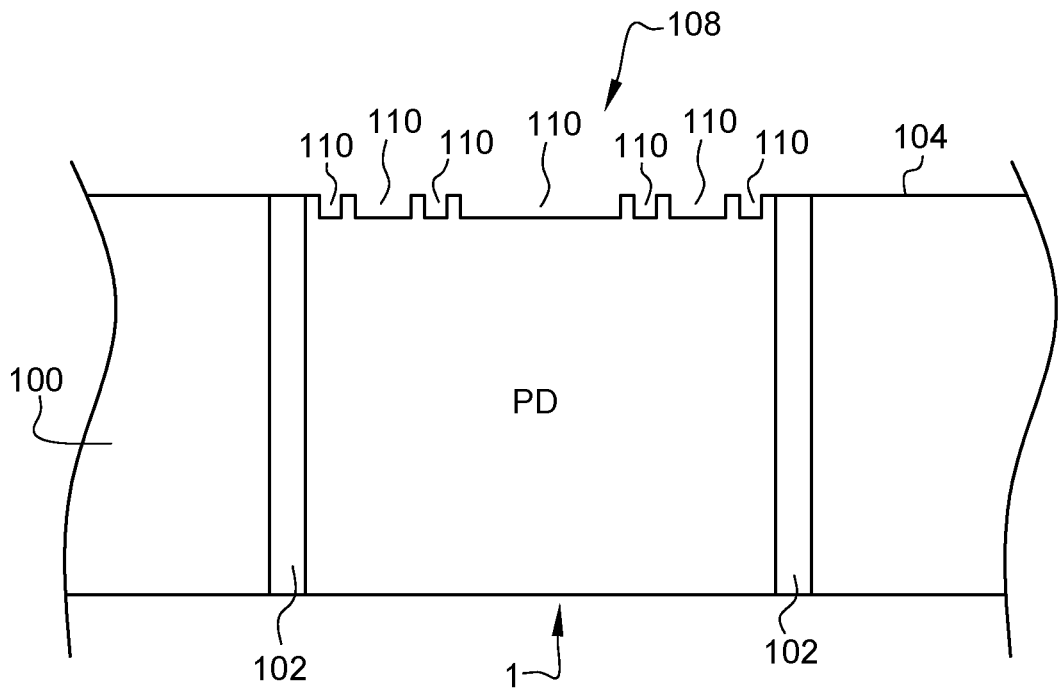
FIG. 3 represents, in a schematic cross-sectional view, an example of one alternative embodiment of the pixel of FIG. 1.

FIG. 3 represents, by way of a schematic cross-sectional view, an example of a variant of one embodiment of the pixel 1 of FIG. 1.

In this variant, the recesses 110 all penetrate the layer 100 to the same depth. This variant of one embodiment is simpler to implement than the embodiment described relative to FIG. 1. However, despite the simplicity of implementation of the fractal structure of FIG. 3, the fractal structure of FIG. 1 presents the advantage of allowing a fractal structure to be generated in the depth of the silicon, and thus increasing the effective area of the silicon as well as its apparent roughness at each iteration order. This maximizes the number of reflections seen by the incident light. This also allows to increase the amount of light entering the pixel and therefore reduces the amount of light reflected out of the pixel that could reach a neighboring pixel, this undesirable phenomenon is commonly called "cross-talk". Increasing the apparent roughness of the silicon also increases the optical path in the silicon.

According to one embodiment, the fractal structure 108 corresponds to a fractal which, expressed in an L-system, is based on ternary Cantor-type rules and whose axiom is a square subdivided into nine sub-squares. In other words, the axiom is a square with three characters on each side. The generating rules are said to be of ternary Cantor-type when, at each iteration, a character of the fractal of order N is replaced by a square of three characters on each side. Moreover, the area that the character in the fractal of the order N would occupy and the area that the nine-character square that replaces it in the fractal of the order N+1—would occupy correspond to the same area in the fractal structure 108. Examples of axioms and generation rules according to this embodiment will now be described in connection with FIGS. 4, 5, 6, and 7.

Figure 4:
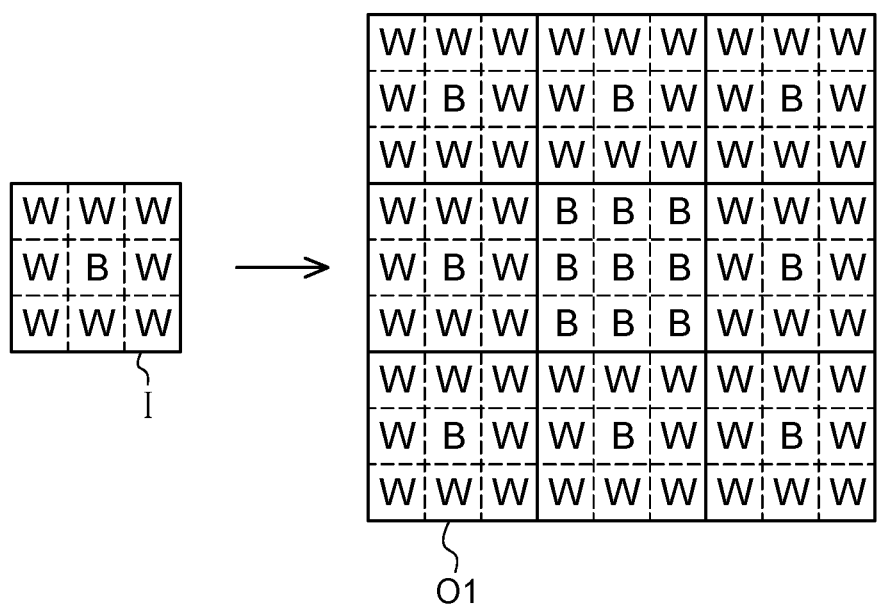
FIG. 4 schematically illustrates a generation of a fractal according to an example of one embodiment of the pixel of FIG. 1.

FIG. 4 schematically illustrates a generation of a fractal according to an example of one embodiment of the pixel of FIG. 1. More precisely, FIG. 4 illustrates a fractal based on ternary Cantor-type rules, from which the fractal structure 108 according to an example of one embodiment of the pixel 1 is generated. The fractal presented here corresponds to the example of the fractal structure 108 illustrated by FIG. 2.

In this example, the fractal is expressed in the L-system determined by:
an alphabet comprising the characters W and B,
an axiom I=WWW+W+BW−W−WW, and
generation rules corresponding to:

$$*W \to WWW + W + BW - W - WW = I, \text{ and}$$

$$*B \to BBB + B + BB - B - BB.$$

By way of explanation, referring to the axiom I represented on the left in FIG. 4, starting from the character at the top left, and initially running through the characters of axiom I from left to right, we do have a character W (top left in axiom I) followed by a character W (top middle in axiom I), followed by a character W (top right in axiom I). Then we turn 90° to the right (+) and we have a character W (right middle in axiom I) before turning again 90° to the right (+) and having a character B (in the middle in axiom I) then a character W (left middle in axiom I). Then, we turn to the left (−) and we have a character W (bottom left in axiom I) before turning again 90° to the left (−) and having a character W (bottom middle in axiom I) then a character W (bottom right in axiom I).

Also by way of explanation, to pass from order 0, i.e. axiom I, to the fractal O1 of order 1 (right in FIG. 4), the rule W→WWW+W+BW−W−WW means that each character W in the axiom is replaced by axiom I, and the rule B BBB+B+BB−B−BB means that each character B in the axiom is replaced by a three-sided square consisting only of the characters B.

Although the fractal O1 of order A, is represented here as being larger than axiom I, in practice, in the fractal structure 108 (FIGS. 1, 2, and 3), axiom I and the fractal O1 of order 0 correspond to the same surface of the face 104.

Although not represented here, to obtain the fractal of order 2 of the L-system corresponding to FIG. 4, it is sufficient to apply the L-system rules to each character of the fractal O1 of order 1, and thus so on.

To obtain the fractal structure 108, it is sufficient to replace, in the fractal of the final order Z, for at least one character of the alphabet, each occurrence of that character by a recess. For example, the fractal structure 108 illustrated in FIG. 4 is obtained from the fractal of final order Z=2 corresponding to the above L-system, by replacing each character B by a recess 110, several characters B being able to correspond to the same recess 110. In this case, the axiom I corresponds to a square subdivided into nine sub-squares, with only the central sub-square corresponding to a recess.

It should be noted that the person skilled in the art is able to provide other ternary Cantor-type generation rules from the axiom I described in relation to FIG. 4, and more generally from an axiom I corresponding to a square with three characters on each side in which only the central character of the axiom corresponds to a recess.

Figure 5:
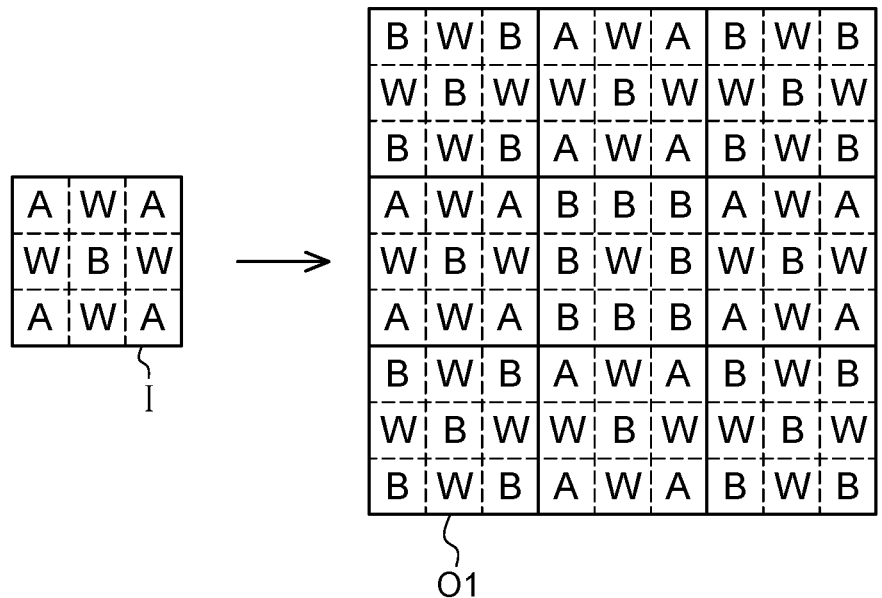
FIG. 5 schematically illustrates a generation of a fractal according to another example of one embodiment of the pixel of FIG. 1.

FIG. 5 schematically illustrates a generation of a fractal according to another example of one embodiment of the pixel of FIG. 1. More precisely, FIG. 5 illustrates a fractal based on ternary Cantor-type rules, from which the fractal structure 108 according to another example of one embodiment of the pixel 1 is generated.

In this example, the fractal is expressed in the L-system determined by:
an alphabet comprising the characters W, B and A
an axiom I=AWA+W+BW−A−WA, and
generation rules corresponding to:

$$*W \to AWA + W + BW - A - WA = I,$$

$$*B \to BBB + B + WB - B - BB, \text{ and}$$

$$*A \to BWB + W + BW - B - WB.$$

As before, FIG. 5 illustrates the axiom I of this L-system (left in FIG. 5) and the corresponding fractal O1 of order 1 (right in FIG. 5). As before, the axiom I and the fractal O1 of order 1 correspond, in practice, to the same surface of the face 104.

By way of explanation, the rule W→AWA+W+BW−A−WA means that each character W is replaced by the axiom I, the rule B→BBB+B+WB−B−BB meaning that each character B is replaced by the complementary of the axiom I in which the complementary of the character A is the character B, and the rule A→BWB+W+BW−B−WB meaning that each character A is replaced by a cross of the characters B on a background of characters W.

To obtain a fractal structure 108, it is sufficient to replace, in the fractal of the final order Z, for at least one character W, B, and A in the alphabet, each occurrence of that character with a recess 110. Preferably, only the character B is replaced by a recess 110, the axiom I then corresponding to a square subdivided into nine sub-squares in which only the central sub-square corresponds to a recess 110.

It should be noted that the person skilled in the art is able to provide other ternary Cantor-type generation rules from the axiom I described in relation to FIG. 5, and more generally from an axiom corresponding to a square of three characters on each side in which only the central character of the axiom corresponds to a recess.

Figure 6:
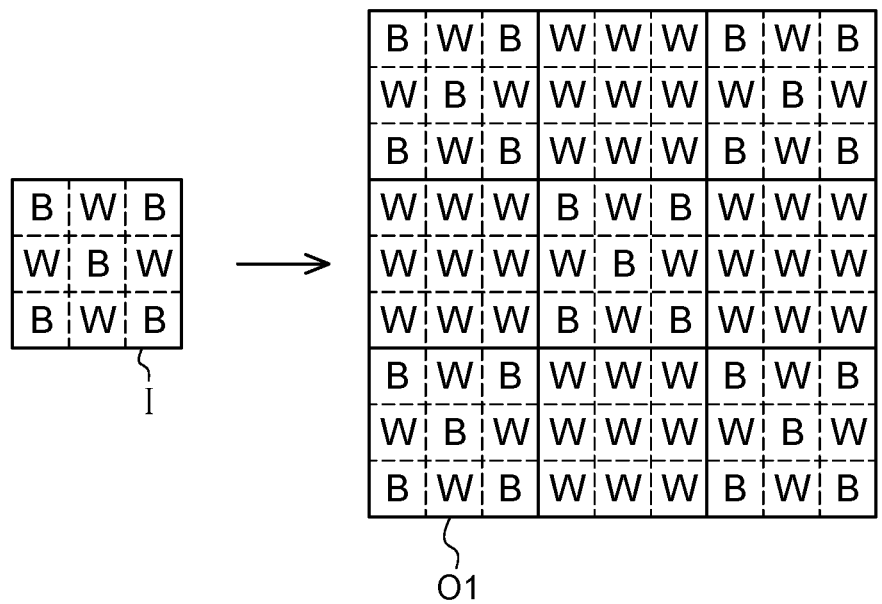
FIG. 6 schematically illustrates a generation of a fractal according to yet another example of one embodiment of the pixel of FIG. 1.

FIG. 6 schematically illustrates a generation of a fractal according to yet another example of one embodiment of the pixel of FIG. 1. More precisely, FIG. 6 illustrates a fractal based on ternary Cantor-type rules, from which the fractal structure 108 according to yet another example of one embodiment of the pixel 1 is generated.

In this example, the fractal is expressed in the L-system determined by:
an alphabet comprising the characters W and B,
an axiom I=BWB+W+BW−B−WB, and generation rules corresponding to:

$$*W \to WWW + W + WW - W - WW, \text{ and}$$

$$*B \to BWB + W + BW - B - WB = I.$$

As before, FIG. 6 illustrates the axiom I of this L-system (left in FIG. 6) and the corresponding fractal O1 of order 1 (right in FIG. 6). As before, the axiom I and the fractal O1 of order 1 correspond, in practice, to the same surface of the face 104.

By way of explanation, the rule W→WWW+W+WW–W–WW means that each character W is replaced by nine characters W, the rule B→BWB+W+BW–B–WB meaning that character B is replaced by the axiom I.

To obtain a fractal structure 108, it is sufficient to replace in the fractal of the final order Z, by at least one character W and B in the alphabet, each occurrence of that character with a recess 110. Preferably, only the character B is replaced by a recess 110, the axiom I then corresponding to a square subdivided into nine sub-squares in which only the sub-squares on the diagonal of the axiom correspond to a recess 110.

It should be noted that the person skilled in the art is able to provide other ternary Cantor-type generation rules from the axiom I described in relation to FIG. 6 and more generally from an axiom I corresponding to a square of three characters on each side in which only the characters on the diagonals of the axiom correspond to recesses.

For example, taking the axiom I described relative to FIG. 6, the above generation rules may be replaced by the following generation rules:

$$W \to WWW + W + BW - W - WW, \text{ and}$$

$$B \to BWB + W + BW - B - WB = I.$$

Figure 7:
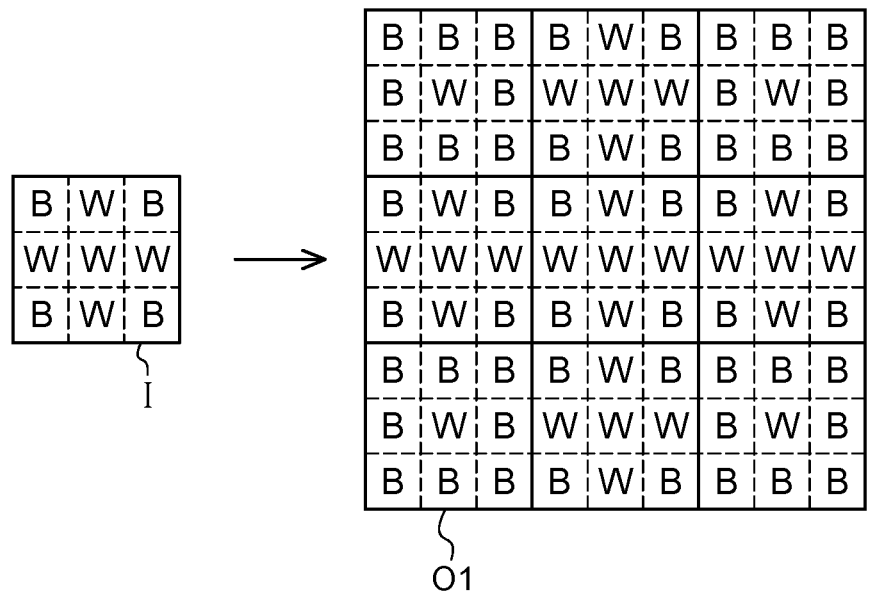
FIG. 7 schematically illustrates a generation of a fractal according to yet another example of one embodiment of the pixel of FIG. 1.

FIG. 7 schematically illustrates a generation of a fractal according to yet another example of one embodiment of the pixel of FIG. 1. More precisely, FIG. 7 illustrates a fractal based on ternary Cantor-type rules, from which the fractal structure 108 according to yet another example of one embodiment of pixel 1 is generated.

In this example, the fractal is expressed in the L-system determined by:
an alphabet comprising the characters W and B,
an axiom I=BWB+W+WW–B–WB, and
generation rules corresponding to:

$$*W \to BWB + W + WW - B - WB = I, \text{ and}$$

$$*B \to BBB + B + WB - B - BB.$$

As before, FIG. 7 illustrates the axiom I of this L-system (left in FIG. 7) and the corresponding fractal O1 of order 1 (right in FIG. 7). As before, the axiom I and the fractal O1 of order 1 correspond, in practice, to the same surface of the face 104.

To obtain a fractal structure 108, it is sufficient to replace in the fractal of final order Z, for at least one character W and B of the alphabet, each occurrence of that character by a recess 110. Preferably, only the character B is replaced by a recess 110, the axiom I then corresponding to a square subdivided into nine sub-squares in which only the sub-squares of the corners of the axiom each correspond to a recess 110.

It should be noted that the person skilled in the art is able to provide other ternary Cantor-type generation rules from the axiom I described in relation to FIG. 7, and more generally from an axiom corresponding to a square of three characters on each side in which only the characters on the corners of the axiom correspond to recesses.

Examples of one embodiment in which the fractal structure 108 corresponds to a fractal that, expressed in an L-system, is based on ternary Cantor-type rules have been described relative to FIGS. 4, 5, 6, and 7. According to another embodiment, the fractal structure 108 is obtained from a fractal that, expressed in an L-system, is based on binary Cantor-type generation rules. In other words, the axiom is a square of two characters on each side. Generation rules are said to be of binary Cantor-type when, at each iteration, a character of the fractal of order N is replaced by a square of two characters of each side to obtain the fractal of order N+1. Furthermore, the area that the character in the fractal of order N would occupy and that which the four-character square that replaces it in the fractal of order N+1 would occupy correspond to the same area in the fractal structure 108. Examples of axioms and generation rules according to this embodiment will now be described relative to FIGS. 8, 9, and 10.

Figure 8:
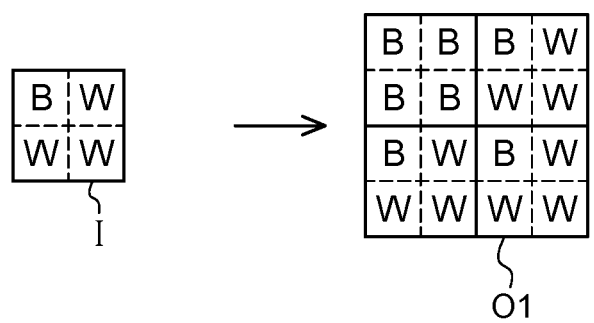
FIG. 8 schematically illustrates a generation of a fractal according to yet another example of one embodiment of the pixel of FIG. 1.

FIG. 8 schematically illustrates a generation of a fractal according to an example embodiment of the pixel of FIG. 1. More precisely, FIG. 8 illustrates a fractal based on binary Cantor-type rules, from which the fractal structure 108, according to the example of one embodiment of the pixel 1, is generated.

In this example, the fractal is expressed in the L-system determined by:
an alphabet comprising the characters W and B,
an axiom I=BW+W+W, and
generation rules corresponding to:

$$*W \to BW + W + W = I, \text{ and}$$

$$*B \to BB + B + B.$$

By way of explanation, to go from order 0, i.e., the axiom I (left in FIG. 8), to fractal O1 of order 1 (right in FIG. 8), the rule W→BW+W+W means that each character W of the axiom is replaced by axiom I, and the rule B→BB+B+B means that each character B of the axiom is replaced by a two-sided square comprising of only B characters.

Although the fractal O1 of order 1 is represented here as being larger than axiom I, in practice, in the fractal structure 108 (FIGS. 1, 2, and 3), axiom I and the fractal O1 of order 0 correspond to the same surface of the face 104.

Although not represented here, to obtain the fractal of order 2 of the L-system corresponding to FIG. 8, it is sufficient to apply the L-system rules to each character of the fractal O1 of order 1, and thus so on.

To obtain a fractal structure 108, it is sufficient to replace, in the fractal of the final order Z and for at least one character of the alphabet, each occurrence of this character by a recess. Preferably, only the character B is replaced by a recess 110, the axiom I then corresponding to a square subdivided into four sub-squares in which only one sub-square of the axiom corresponds to a recess 110.

It should be noted that the person skilled in the art is able to provide other binary Cantor-type generation rules from the axiom I described relative to FIG. 8, or more generally, from an axiom I corresponding to a square of two characters on each side in which a single character corresponds to a recess.

For example, the above generation rules may be replaced by the following generation rules:

$$W \rightarrow BW + W + W = I, \text{ and}$$
$$B \rightarrow WB + B + B.$$

According to another example, the above generation rules can be replaced by the following generation rules:

$$W \rightarrow BW + W + W = I, \text{ and}$$
$$B \rightarrow WW + B + W.$$

According to yet another example, the above generation rules can be replaced by the following generation rules:

$$W \rightarrow BW + W + W = I, \text{ and}$$
$$B \rightarrow BB + W + B.$$

Figure 9:
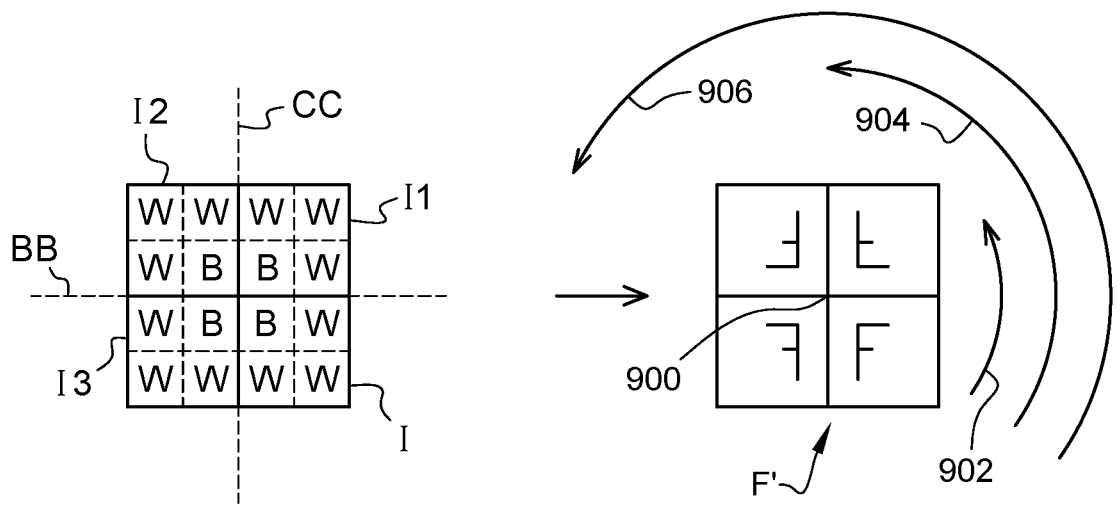
FIG. 9 schematically illustrates a detail of an example of one embodiment of the pixel of FIG. 1.

FIG. 9 schematically illustrates a detail of an example of one embodiment of the pixel of FIG. 1. More particularly, FIG. 9 illustrates a detail of an example of one embodiment of the pixel of FIG. 1, in the case where the pixel 1 comprises several fractal structures 108 obtained from a single fractal.

Indeed, fractals obtained with an L-system of the type described in connection with FIG. 8, i.e., in which the axiom I is not symmetrical by successive rotations of angle equal to 90° about an axis passing through the center of the axiom, are also not symmetrical by successive rotations of angle equal to 90° about an axis passing through the center of the fractal. This leads to a fractal structure 108 that is not symmetrical by successive rotations of angle equal to 90° about an axis passing through the center of the fractal structure 108. Such symmetry is generally desirable in optical devices where the axis passing through the center of the fractal structure 108 is the optical axis of the device.

Thus, according to one embodiment, after having generated a fractal F from an axiom I of the type described relative to FIG. 8, a fractal F' is generated, the fractal F' presenting symmetry by successive rotations of angle equal to 90° about an axis passing through the center of the fractal F'. More particularly, the fractal F' is obtained by copying the fractal F a first time after a rotation of angle equal to 90° about an axis passing through a corner 900 of the fractal F as illustrated by an arrow 902, then by copying a second time the fractal F after a rotation of angle equal to 180° around the axis passing by the corner 900 of the fractal F as illustrated by the arrow 904, and finally by copying a third time the fractal F after a rotation of angle equal to 270° around the axis passing by the corner 900 of the fractal F as illustrated by the arrow 906.

In other words, the fractal F' is obtained by successive symmetries by rotation of an angle equal to 90° around the axis passing through the corner 900 of the fractal F.

In other words, this amounts to generating four fractals from four corresponding axioms I, I1, I2 and I3, the axioms I, I1, I2 and I3 being symmetrical two by two with respect to two planes BB and CC orthogonal to each other. The generation rules applied to each axiom I, I1, I2, and I3 are then determined to maintain, at each order, the same symmetry between the fractals arising from the respective axioms I, I1, I2, and I3 as that between the axioms I, I1, I2, and I3. The fractal structure 108 is obtained from the fractal F' or seen otherwise, the four fractals obtained from the respective axioms I, I1, I2 and I3 each lead to a corresponding structure 108, and the device 1 then comprises four different but symmetrical two by two structures 108 by successive rotations of angle equal to 90°.

The construction of a fractal F' from a fractal F by successive rotations of angle equal to 90° about an axis passing through a corner of the fractal F can be applied to the embodiment described relative to FIGS. 4, 5, 6, and 7, but also to the embodiments to be described relative to FIGS. 10, 11, 12, and 13.

Figure 10:
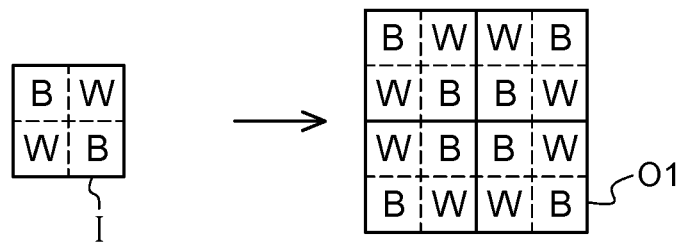
FIG. 10 schematically illustrates a generation of a fractal according to yet another example of one embodiment of the pixel of FIG. 1.

FIG. 10 schematically illustrates a generation of a fractal according to an example of one embodiment of the pixel of FIG. 1. More precisely, FIG. 10 illustrates a fractal based on binary Cantor-type rules, from which the fractal structure 108 according to an example of one embodiment of the pixel 1 is generated.

In this example, the fractal is expressed in the L-system determined by:
- an alphabet comprising the characters W and B,
- an axiom I=BW+B+W, and
- generation rules corresponding to:

$$*W \rightarrow WB + W + B, \text{ and}$$
$$*B \rightarrow BW + B + W = I.$$

By way of explanation, to go from order 0, i.e., axiom I (left in FIG. 10), to the fractal O1 of order 1 (right in FIG. 10), the rule W→WB+W+B means that each character W of the axiom is replaced by the complementary of the axiom I, and the rule B→BW+B+W means that each character B of the axiom is replaced by the axiom I.

Although the fractal O1 of order 1 is represented here as being larger than axiom I, in practice, in the fractal structure 108 (FIGS. 1, 2, and 3), axiom I and the fractal O1 of order 0 correspond to the same area of the face 104.

Although not represented here, to obtain the fractal of order 2 of the L-system corresponding to FIG. 10, it is sufficient to apply the L-system rules to each character of the fractal O1 of order 1, and thus so on.

To obtain a fractal structure 108, it is sufficient to replace, in the fractal of the final order Z and for at least one character of the alphabet, each occurrence of this character by a recess. Preferably, only the character B is replaced by a recess 110, the axiom I then corresponding to a square subdivided into four sub-squares in which only the sub-squares of a diagonal of the axiom I each correspond to a recess 110.

It should be noted that the person skilled in the art is able to provide other binary Cantor-type generation rules from the axiom I described in connection with FIG. 10, or, more generally, from an axiom I corresponding to a square of two characters on each side in which only the characters on a diagonal of the axiom correspond to recesses.

In the previously described embodiments, the fractal structure 108 is obtained from a fractal based on ternary Cantor, or binary Cantor-type generation rules. In another embodiment, the fractal structure is obtained from a fractal selected from a Hilbert curve, a Peano curve, and a Mandelbrot H-tree, with each segment of the Hilbert curve, Peano curve, and Mandelbrot H-tree, respectively, preferably corresponding to a recess in the fractal structure 108, such as a trench.

Figure 11:
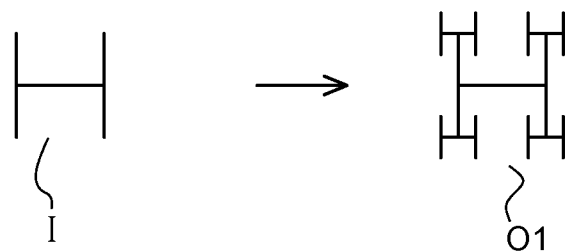
FIG. 11 schematically illustrates a generation of a fractal according to yet another example of one embodiment of the pixel of FIG. 1.

FIG. 11 schematically illustrates a generation of a fractal according to yet another example of one embodiment of the pixel of FIG. 1. Specifically, FIG. 11 schematically illustrates the axiom I of a fractal corresponding to a Mandelbrot H-tree and the corresponding fractal O1 of order 1. The expression of a Mandelbrot H-fractal in an L-system is well known and will not be detailed here.

Figure 12:
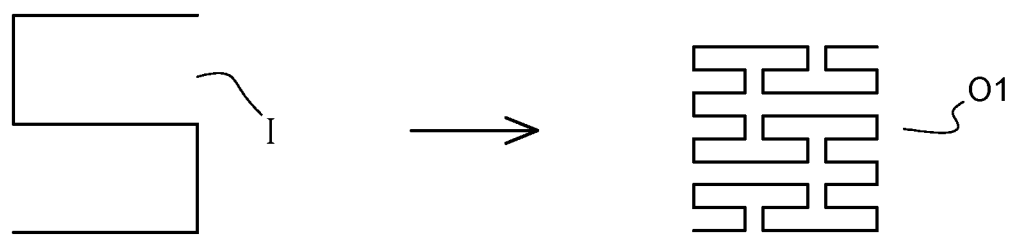
FIG. 12 schematically illustrates a generation of a fractal according to yet another example of one embodiment of the pixel of FIG. 1.

FIG. 12 schematically illustrates a generation of a fractal according to yet another example of the embodiment of the pixel of FIG. 1. Specifically, FIG. 12 schematically illustrates the axiom I of a Peano fractal and the corresponding fractal O1 of order 1. The expression of a Peano fractal in an L-system is well known and will not be detailed here.

Figure 13:
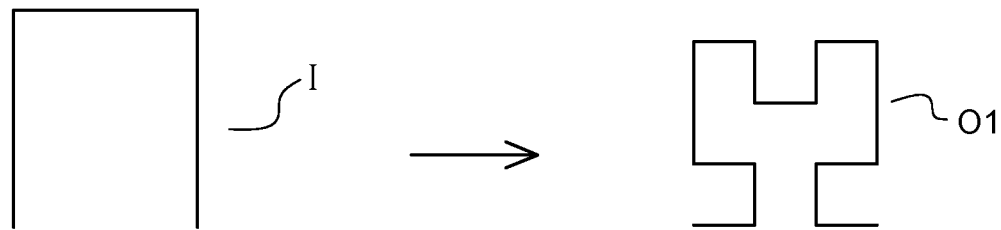
FIG. 13 schematically illustrates a generation of a fractal according to yet another example of one embodiment of the pixel of FIG. 1.

FIG. 13 schematically illustrates a generation of a fractal according to yet another example of the embodiment of the pixel of FIG. 1. Specifically, FIG. 13 schematically illustrates the axiom I of a Hilbert fractal and the corresponding fractal O1 of order 1. The expression of a Hilbert fractal in an L-system is well known and will not be detailed here.

Examples of the embodiments of a pixel 1 of the type described in connection with FIG. 1, and more particularly examples of the fractals from which the corresponding fractal structures 108 can be generated, have been described previously. These examples of the embodiment apply to the pixel 1 described relative to FIG. 3.

Figure 14:
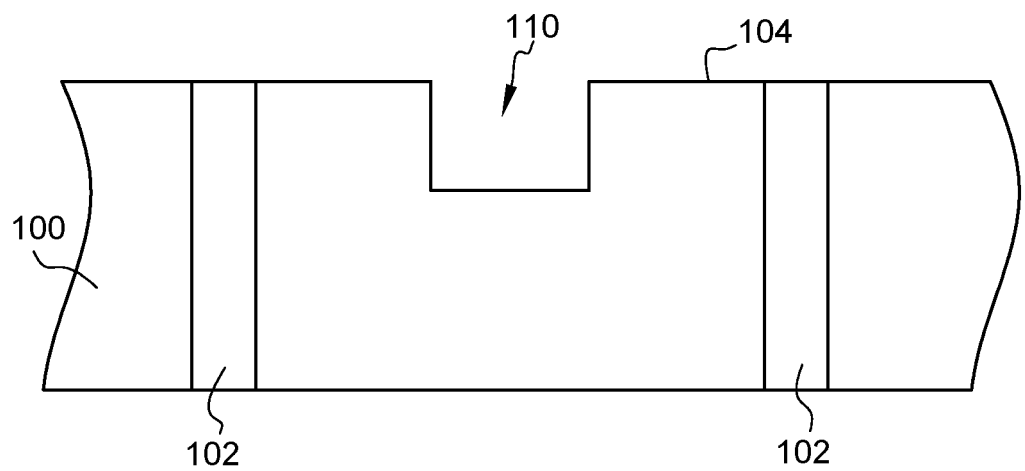
FIG. 14 illustrates a schematic cross-sectional view of a step of an implementation method for manufacturing the pixel of FIG. 1.

FIG. 14 illustrates in a schematic cross-sectional view a step of an embodiment of a method for manufacturing the pixel 1 of FIG. 1. In this example, the method is described for the case where the fractal structure 108 is the one described in connection with FIGS. 1 and 2, although this method is adaptable to other examples of the embodiment described above.

In the step represented in FIG. 14, a recess 110 has been etched into the layer 100 from the face 104. This recess 110 corresponds to character B of axiom I (order 0), as the area occupied by character B at order 0 is always occupied by characters B in the fractal of order 2 (central black area on the fractal structure 108 in FIG. 2).

In other words, in this first etching step, the larger recesses 110 in the fractal structure 108 are etched.

In other words, in this first etching step, the recesses 110 that are generated at the order 0 and are still present in the fractal of the final order Z from which the fractal structure 108 is generated are etched.

Figure 15:
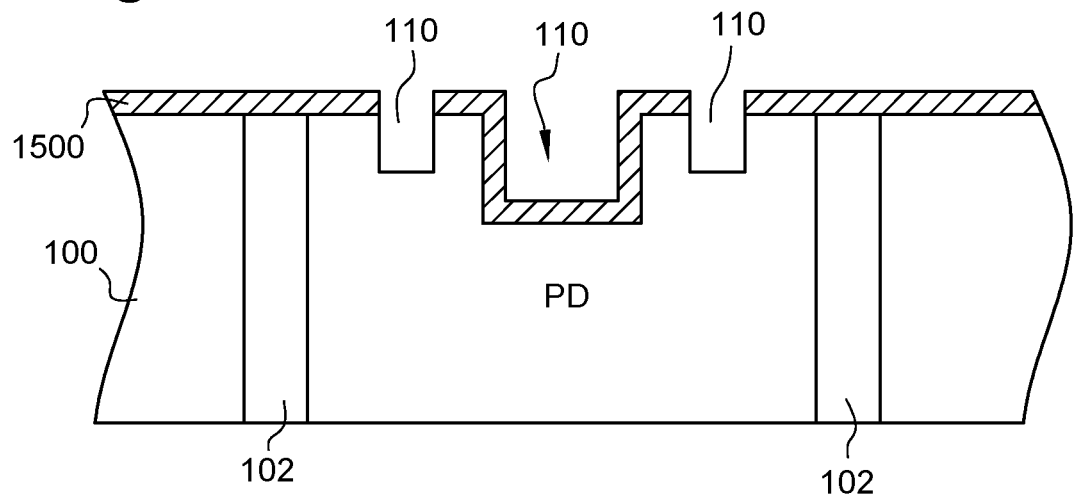
FIG. 15 illustrates by a schematic cross-sectional view another step of a method for manufacturing of FIG. 13 according to a mode of implementation.

FIG. 15 illustrates in a schematic cross-sectional view another step of the manufacturing method of FIG. 14, according to a method of implementation. More particularly, FIG. 15 illustrates a step following the step described relative to FIG. 14.

In the step represented in FIG. 15, recesses 110 have been etched into the layer 100, starting from the face 104. These recesses 110 correspond to the characters B of the fractal O1 of order 1 (FIG. 4), and more specifically to the characters B that are generated at order 1 and for which the area occupied by each character B at order 1 is always occupied by characters B in the fractal of the final order 2 (the nine black outlying areas on the fractal structure 108 of FIG. 2).

Said otherwise, in this etching step, recesses 110 in the fractal structure 108 are etched that have, in the plane of the face 104, smaller dimensions than the recess(es) 110 etched in the previous etching step (FIG. 14) and larger dimensions than the recess(es) 110 that will be etched in subsequent steps.

Said in another way, in this first etching step, the recesses 110 that are generated at order 1 and are still present in the fractal of the final order Z, from which the fractal structure 108 is generated, are etched.

In this embodiment, the etching depth of the recesses 110 decreases with the order at which the recesses are etched. Thus, the recesses etched in the etching step of FIG. 15 are less deep than the recess or recesses etched in the previous etching step described in connection with FIG. 14.

In this embodiment, in each etching step, only recesses 110 having, in the plane of the face 104, the same dimensions, are etched, with the same etching depth for all recesses etched in that step.

In this embodiment, the recesses 110 etched in previous etching steps are masked by an etching mask 1500. Thus, in this example, the recess 110 etched in the step of FIG. 14 is masked by the mask 1500 when smaller recesses 110 are etched in the step of FIG. 15.

Figure 16:
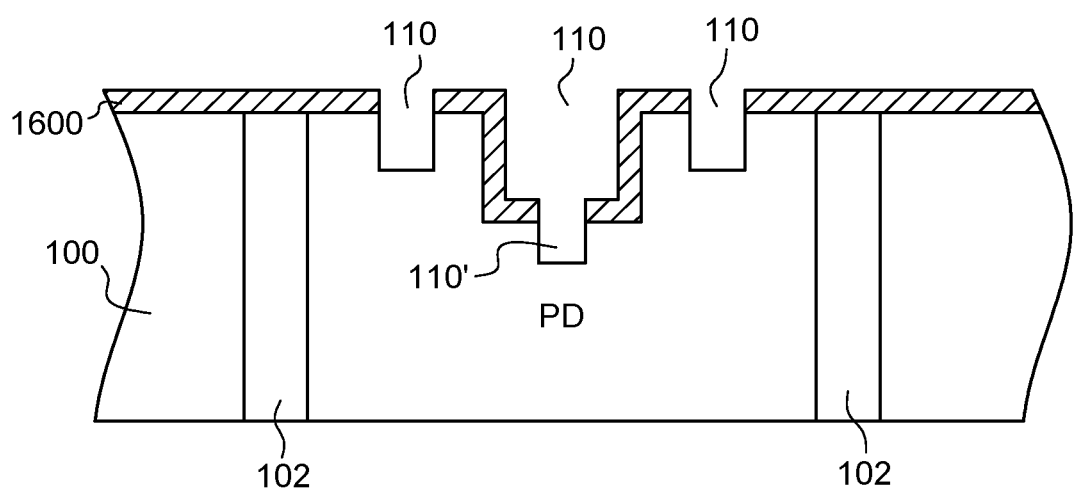
FIG. 16 illustrates a schematic cross-sectional view of an alternative implementation of the step of FIG. 15.

FIG. 16 illustrates an alternative implementation of the step of FIG. 15. Only the differences between the step described relative to FIG. 15 and the step described relative to FIG. 16 are highlighted here.

Compared to FIG. 15, in FIG. 16, in the step of etching the recesses 110 having smaller dimensions than the recess etched in the step of FIG. 14, but larger than the recess(es) 110 that will be etched in subsequent etching steps, at least one additional recess 110' of the same size as the recesses 110 etched in the current step illustrated in FIG. 15, is etched at the bottom of the recesses 110 etched in the previous etching step described relative to FIG. 14. Thus, in this example, a recess 110' is etched at the bottom of the central recess 110 etched in the step of FIG. 14. Thus, the etching mask 1600 used here comprises an opening in the bottom of this recess 110.

Although not illustrated, the step described relative to FIG. 15, respectively FIG. 16, is then implemented recursively up to the fractal of the final order Z, so as to obtain the corresponding structure 108.

Said differently, in the embodiment of FIGS. 14 and 15, as in the embodiment of FIGS. 14 and 16, several etching substeps each corresponding to a different order of the fractal and consisting of etching the recesses corresponding to that order of the fractal are implemented. These successive etching substeps are implemented in ascending order of the order of the fractal to which each etching sub step corresponds.

In addition, for each etching sub-step, all the recesses 110, and 110' if applicable, etched during this etching sub-step have, in the plane of the face 104, the same dimensions, these dimensions decreasing from one etching sub-step to a subsequent etching sub-step.

Furthermore, in each etching sub-step, the etching depth of the recesses 110, and 110' if any, decreases relative to the etching depth of the recesses 110, and 110' if any, of the previous etching sub-step.

Figure 17:
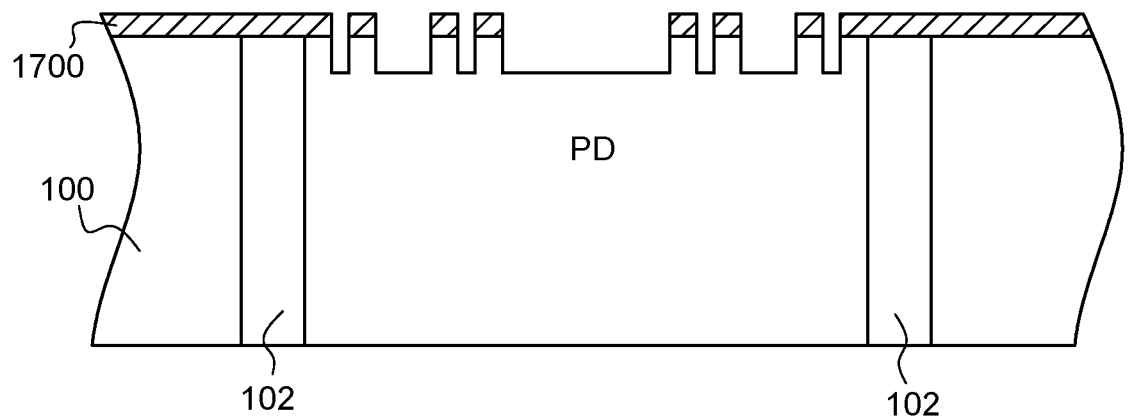
FIG. 17 illustrates a schematic cross-sectional view of a step in a method for manufacturing the pixel of FIG. 3.

FIG. 17 illustrates a schematic cross-sectional view of a step in a method of implementation of a method for manufacturing the pixel of FIG. 3. In this example, the method is described for the case where the fractal structure 108 is that described relative to FIGS. 2 and 3, although this method is adaptable to other examples of the embodiments described above.

In the step of FIG. 17, all the recesses 110 of the fractal structure 108 are etched simultaneously, with the same etching depth. Unlike the embodiments of FIGS. 14, 15, and 16, the embodiment of FIG. 17 requires only one etching mask 1700 and is therefore simpler to implement. Preferably, fractal structures 108 obtained from a fractal as described in connection with FIG. 11, 12 or 13 are etched with the method of FIG. 17.

Embodiments and variations in the case of a pixel 1 have been described above, however these embodiments and variations are adaptable to other optical devices than a pixel. For example, the optical device may be an optical diffuser, i.e., an optical device comprising a layer, a first face of which is intended to receive light, and a second face which is intended to emit light so that the emitted light is diffuse. The emitted light corresponds to light received by the first face, which has passed through the layer and been diffused by a fractal structure 108 of the second face.

Figure 18:
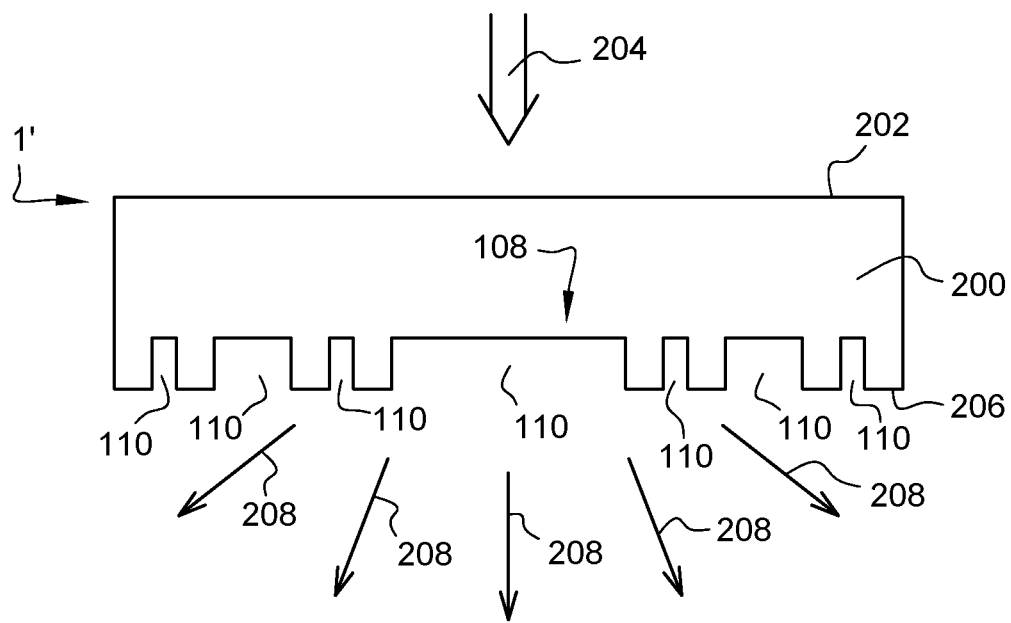
FIG. 18 represents, in a schematic cross-sectional view, a layer of an optical diffuser according to one embodiment similar to the embodiment of the pixel of FIG. 1.

FIG. 18 represents, in a schematic cross-sectional view, a layer 200 of an optical diffuser 1' according to one embodiment similar to the embodiment of the pixel 1 of FIG. 1. However, the person skilled in the art is able to provide an optical diffuser 1' according to one embodiment similar to the embodiment of the pixel 1 of FIG. 3.

The optical diffuser 1' comprises a layer 200. A face 202 of the layer 200 is intended to receive light 204 and a face 206, at the other side of the face 202, is intended to emit light 208, the light 208 being more diffuse than the light 204. The face 206 comprises a fractal structure 108.

The structure 108 is of the type previously described in connection with FIGS. 1, 2, 3, 4, 5, 7, 8, 9, 10, 11, 12, and 13, and can be fabricated with the implementation methods and alternative manufacturing methods described relative to FIGS. 14, 15, 16, and 17, by replacing the face 104 and layer 100 of the device 1 with the face 206 and layer 200 of the device 1'.

As an example, in the pixel 1, respectively in the diffuser 1', the layer 100, respectively the layer 200, is a silicon layer when the operating wavelength of the pixel 1, respectively of the diffuser 1', is in the infrared, for example when this wavelength is in the range of 940 nm.

Various embodiments and variants have been described. Those skilled in the art will understand that certain features of these embodiments can be combined and other variants will readily occur to those skilled in the art. However, the person skilled in the art is able to provide axioms and generation rules that preclude obtaining a fractal corresponding to a periodic grating.

Finally, the practical implementation of the embodiments and variants described herein is within the capabilities of those skilled in the art based on the functional description provided hereinabove.

The invention claimed is:

1. An optical device, comprising:
   a layer having a face configured to be traversed by light at an operating wavelength of the optical device;
   wherein the face comprises a Lindenmayer system (L-system) fractal structure including a plurality of no recesses at said face and a plurality of recesses penetrating into the layer from said face;
   said recesses having a depth that is only a portion of a thickness of the layer; and
   wherein a recess of said plurality of recesses is present in said face corresponding to each location of a first character of a plurality of characters of an alphabet of the L-system a fractal structure and no recess is present in said face corresponding to each location of a second character of the plurality of characters of an alphabet of the L-system fractal structure.

2. The device according to claim 1, wherein each recess has, in a plane of the face, dimensions at least two times smaller than the operating wavelength.

3. The device according to claim 1, wherein the recesses are blind holes having a shape selected from a group consisting of: cylindrical, cubic, rectangular parallelepiped, or pyramidal.

4. The device according to claim 1, wherein the recesses are blind holes formed by trenches.

5. The device according to claim 1, wherein the L-system fractal structure lacks rotational symmetry.

6. The device according to claim 1, wherein a fractal of the L-system fractal structure is selected from the group consisting of:
   a Hilbert curve, each segment of the Hilbert curve corresponding to the recess location of the L-system fractal structure;
   a Peano curve, each segment of the Peano curve corresponding to the recess location of the L-system fractal structure; and
   a Mandelbrot H-tree, each segment of the Mandelbrot H-tree corresponding to the recess location in the L-system fractal structure.

7. The device according to claim 6, wherein the L-system fractal structure is at least of order 3.

8. The device according to claim 6, wherein all of the recesses penetrate to the same depth into the layer.

9. The device according to claim 6, wherein a depth of each recess in the layer decreases when the order at which the recess is generated increases.

10. The device according to claim 1, wherein a fractal of the L-system fractal structure is selected from the group consisting of:
    a fractal based on ternary Cantor-type rules and whose axiom corresponds to a large square divided into nine small squares, only the central small square of the large square corresponding to the recess location of the L-system fractal structure;
    a fractal based on ternary Cantor-type rules and whose axiom corresponds to a large square divided into nine small squares, only the small squares of the diagonals of the large square corresponding each to the recess location of the L-system fractal structure; and
    a fractal based on ternary Cantor-type rules and whose axiom corresponds to a large square divided into nine small squares, only the small squares of the corners of the large square each corresponding to the recess location of the L-system fractal structure.

11. The device according to claim 10, wherein the L-system fractal structure is at least of order 3.

12. The device according to claim 10, wherein all of the recesses penetrate to the same depth into the layer.

13. The device according to claim 10, wherein a depth of each recess in the layer decreases when the order at which the recess is generated increases.

14. The device according to claim 1, wherein a fractal of the L-system fractal structure is selected from the group consisting of:
    a fractal based on binary Cantor-type rules and whose axiom corresponds to a large square divided into four small squares, with only one of the small squares corresponding to the recess location of the L-system fractal structure; and
    a fractal based on binary Cantor-type rules and whose axiom corresponds to a square divided into four small squares, with only the small squares of one diagonal of the large square each corresponding to the recess location of the L-system fractal structure.

15. The device according to claim 14, wherein the L-system fractal structure is at least of order 3.

16. The device according to claim 14, wherein all of the recesses penetrate to the same depth into the layer.

17. The device according to claim 14, wherein a depth of each recess in the layer decreases when the order at which the recess is generated increases.

18. The device according to claim 1, wherein the layer is made of silicon.

19. A pixel, comprising:
- a photosensitive area arranged in the layer of the device according to claim 1;
- wherein the face of the layer is configured to receive light; and
- wherein light received by the photosensitive area passes through the fractal structure.

20. An optical diffuser, wherein the layer of the device according to claim 1 is configured to be traversed by light; and
- wherein the face of the layer is configured to emit light having traversed the fractal structure.

* * * * *